US008824199B2

(12) United States Patent
Noguchi et al.

(10) Patent No.: US 8,824,199 B2
(45) Date of Patent: Sep. 2, 2014

(54) MAGNETIC RANDOM ACCESS MEMORY AND MEMORY SYSTEM

(71) Applicant: Kabushiki Kaisha Toshiba, Tokyo (JP)

(72) Inventors: Hiroki Noguchi, Yokohama (JP); Shinobu Fujita, Inagi (JP); Keiko Abe, Yokohama (JP); Kumiko Nomura, Yokohama (JP); Kazutaka Ikegami, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 13/763,068

(22) Filed: Feb. 8, 2013

(65) Prior Publication Data

US 2013/0301345 A1     Nov. 14, 2013

(30) Foreign Application Priority Data

May 14, 2012  (JP) ................................ 2012-110720

(51) Int. Cl.
*G11C 11/00* (2006.01)
*G11C 11/16* (2006.01)

(52) U.S. Cl.
CPC ........ *G11C 11/1675* (2013.01); *G11C 11/1673* (2013.01)
USPC .......................................... 365/158; 365/173

(58) Field of Classification Search
USPC ................................................. 365/158, 173
See application file for complete search history.

(56) References Cited

U.S. PATENT DOCUMENTS 7,233,537 B2 * 6/2007 Tanizaki et al. ............... 365/209
8,416,612 B2 * 4/2013 Higo et al. .................... 365/158
2006/0098478 A1 * 5/2006 Ezaki et al. ................... 365/158
2011/0289385 A1 * 11/2011 Takeuchi et al. .............. 714/764

FOREIGN PATENT DOCUMENTS

| JP | 8-45275    | 2/1996 |
| JP | 2004-86986 | 3/2004 |
| JP | 2009-129491 | 6/2009 |

OTHER PUBLICATIONS

Sun, Z. et al., "Variation Tolerant Sensing Scheme of Spin-Transfer Torque Memory for Yield Improvement," Proceedings of the International Conference on Computer-Aided-Design, pp 432-437, (Nov. 2010).

Cho, S. et al., "Flip-N-Write: A Simple Deterministic Technique to Improve PRAM Write Performance, Energy and Endurance," Proceedings of the 42$^{nd}$ Annual IEEE/ACM International Symposium on Microarchitecture, pp. 347-357, (Dec. 2009).

First Office Action issued by the Japanese Patent Office on May 7, 2013, for Japanese Patent Application No. 2012-110720, and English-language translation thereof.

* cited by examiner

*Primary Examiner* — Michael Tran
(74) *Attorney, Agent, or Firm* — Finnegan, Henderson, Farabow, Garrett & Dunner, LLP

(57) ABSTRACT

According to one embodiment, a magnetic random access memory includes a write circuit to write s-bit (s is a natural number equal to 2 or greater) write data to magnetoresistive elements, and a read circuit to read s-bit read data from the magnetoresistive elements. The control circuit is configured to select one of first and second modes based on a mode selection signal, read the read data by the read circuit and write one of the write data and inversion data of the write data to the magnetoresistive elements by the write circuit based on the read data and the write data if free space of the buffer memory is equal to a fixed value or more when the second mode is selected.

21 Claims, 10 Drawing Sheets

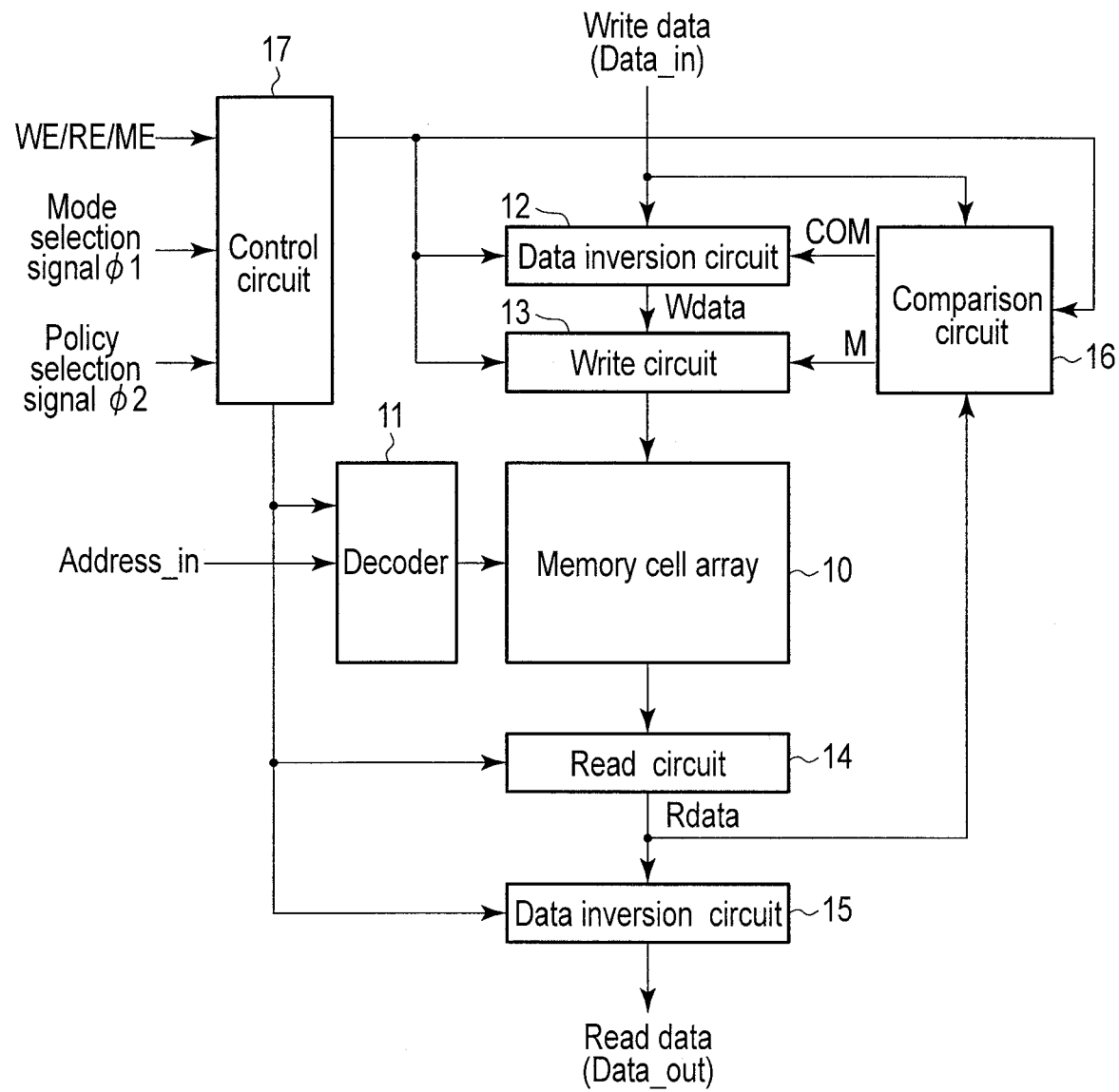
F I G. 1

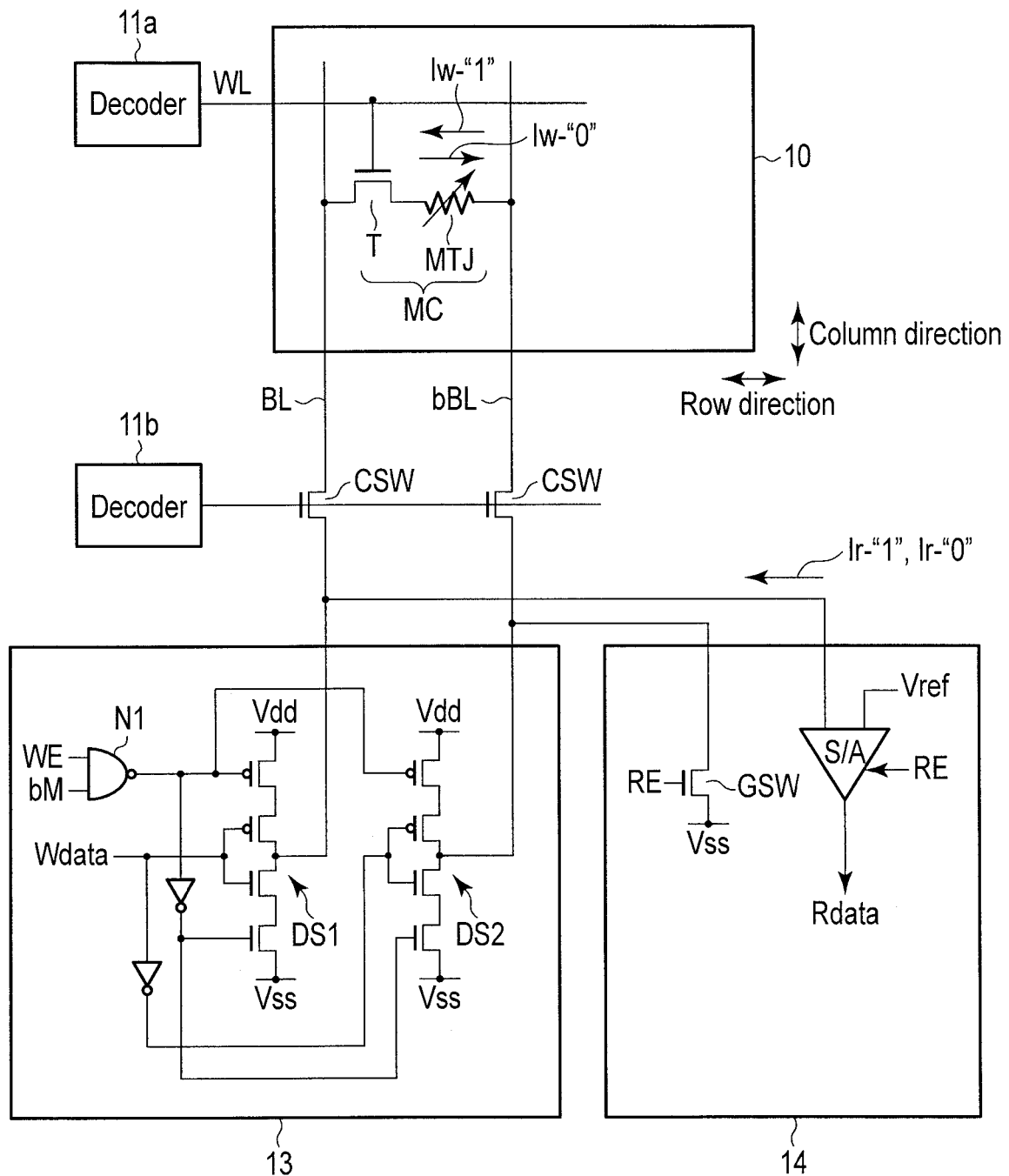
F I G. 3

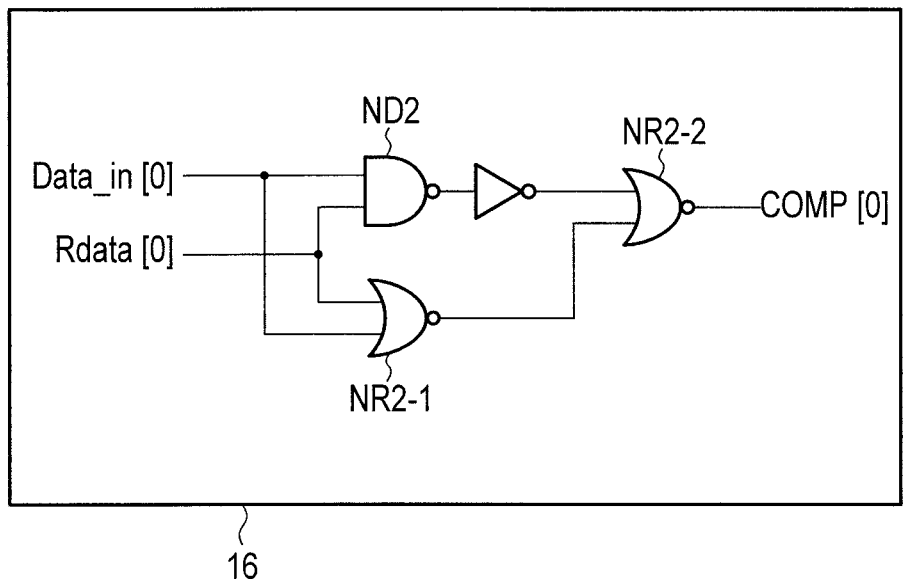
F I G. 4

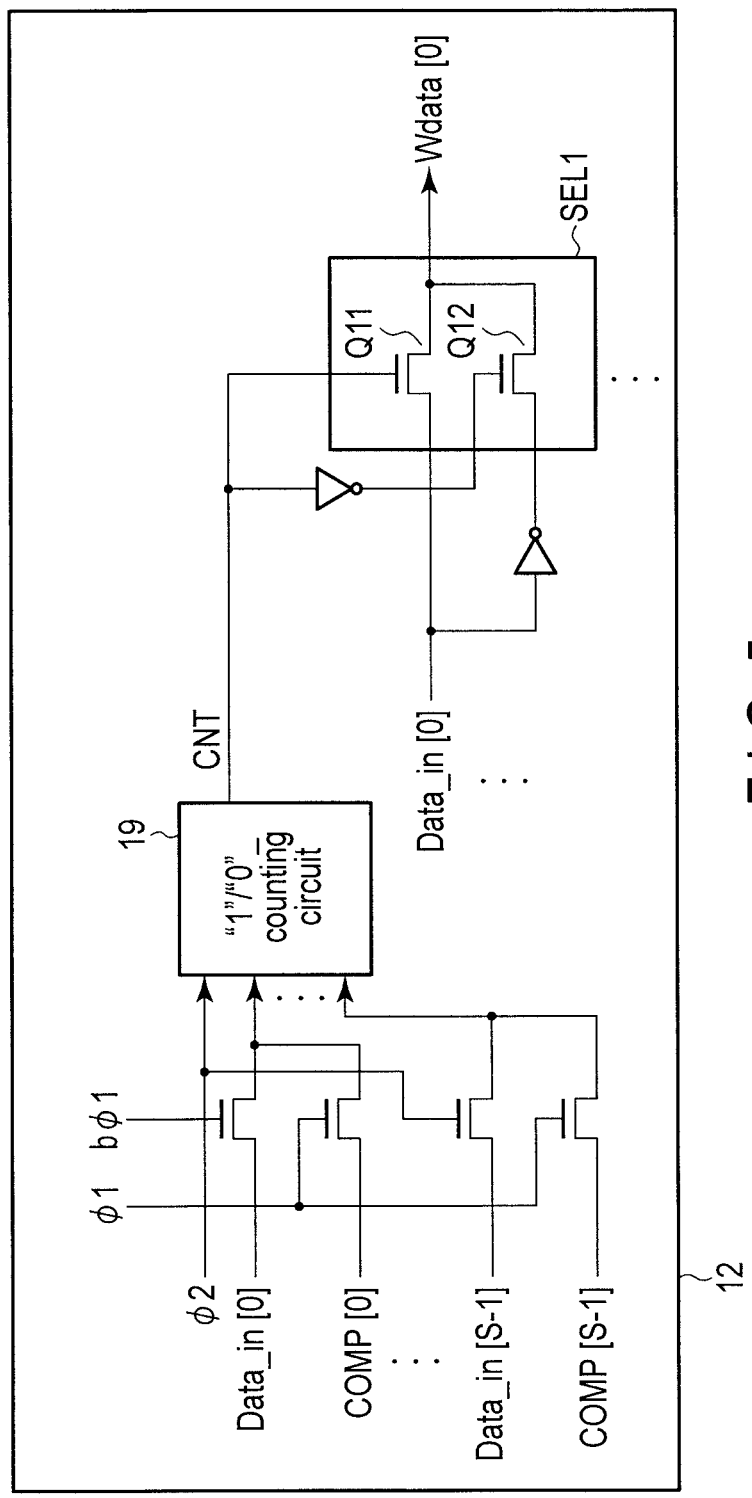
F I G. 5

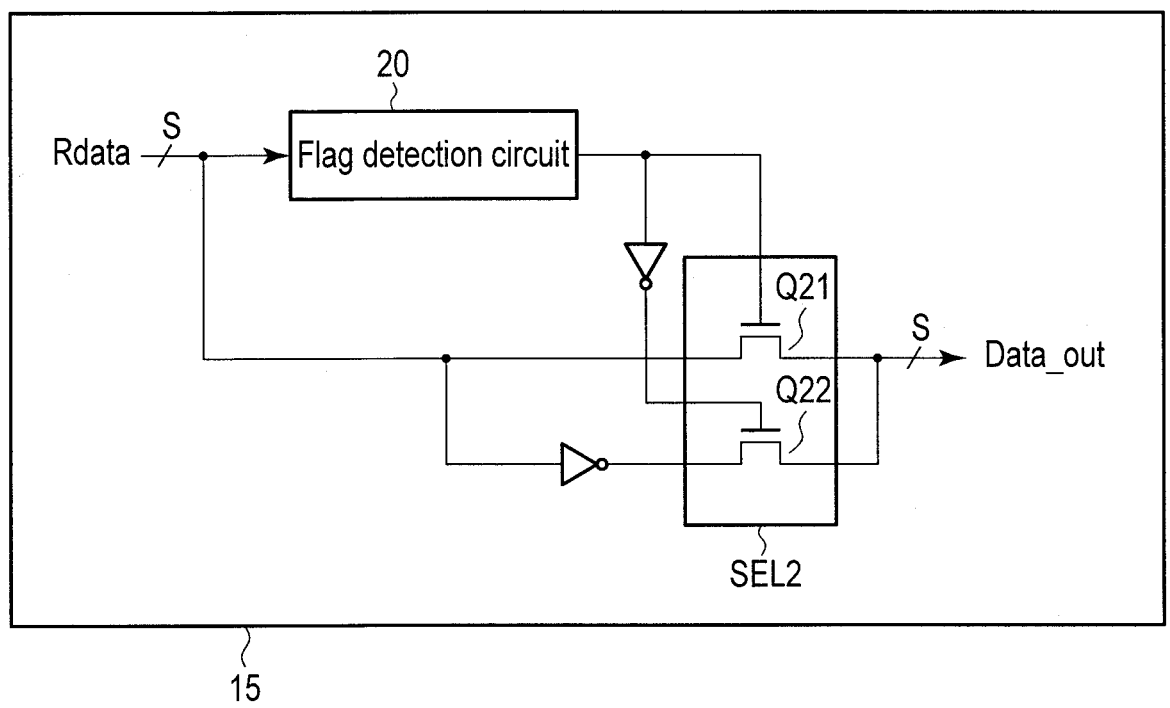
F I G. 7

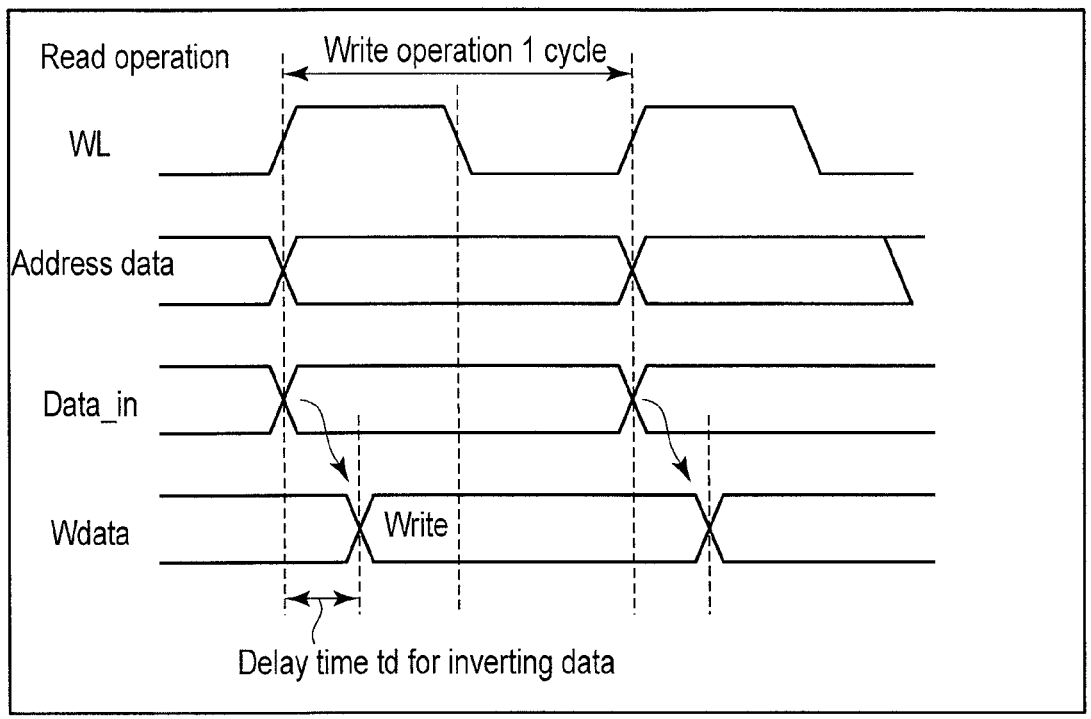
F I G. 10A
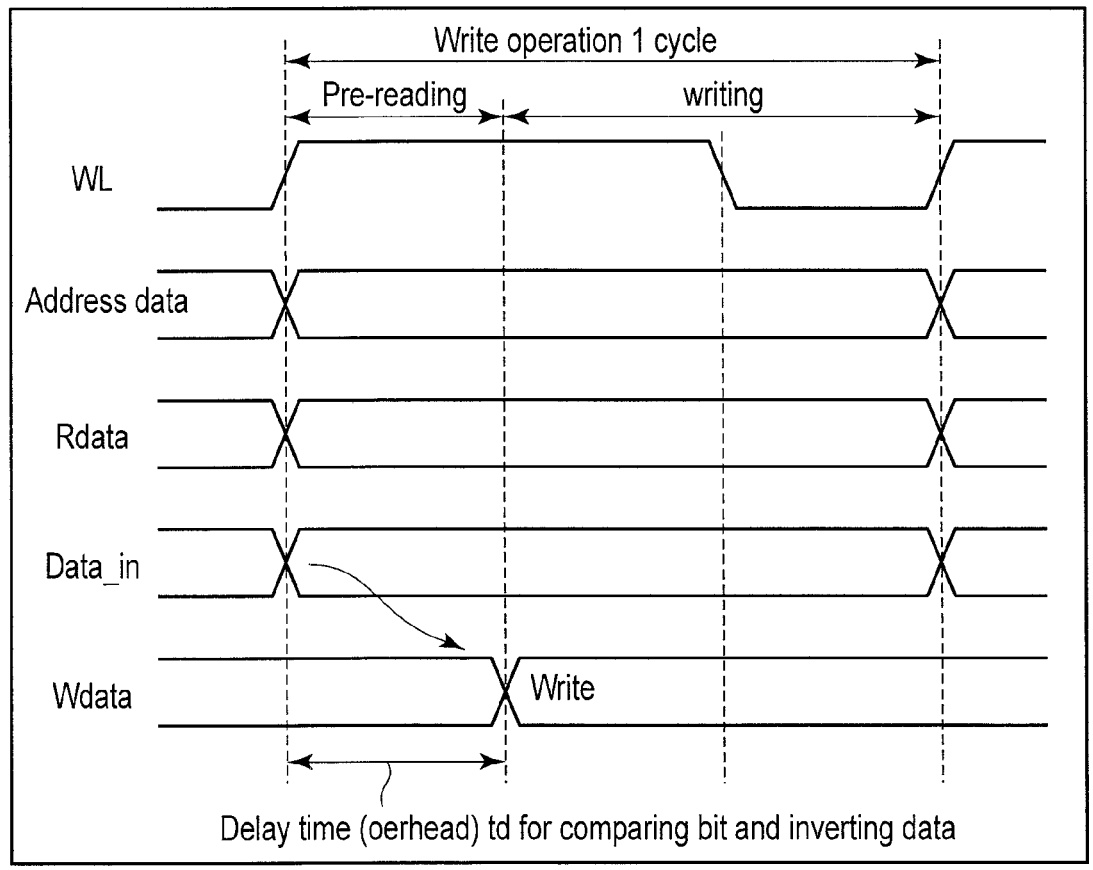
F I G. 10B

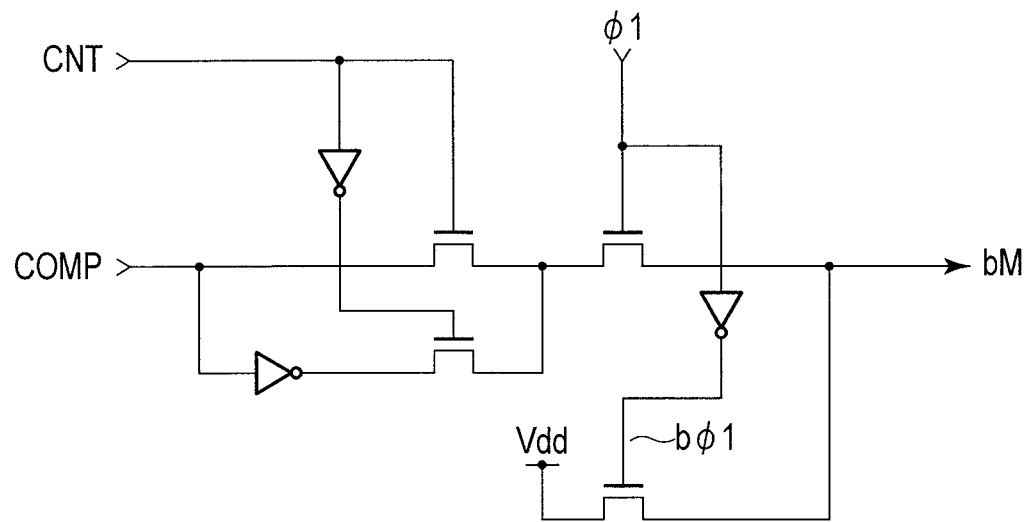
F I G. 11
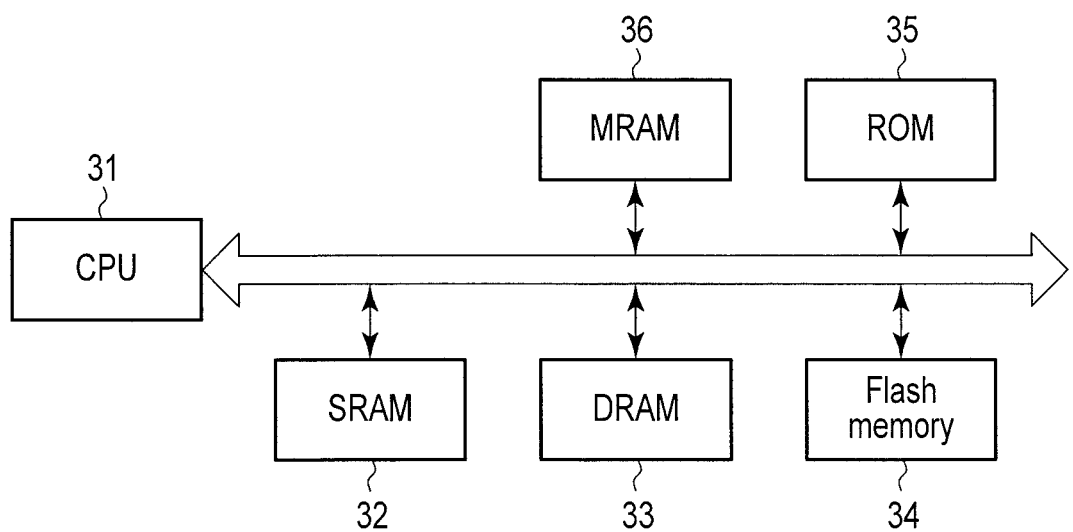
F I G. 12

MAGNETIC RANDOM ACCESS MEMORY AND MEMORY SYSTEM

CROSS-REFERENCE TO RELATED APPLICATIONS

This application is based upon and claims the benefit of priority from Japanese Patent Application No. 2012-110720, filed May 14, 2012, the entire contents of which are incorporated herein by reference.

FIELD

Embodiments described herein relate generally to a magnetic random access memory and a memory system.

BACKGROUND

In recent years, development of technology seeking to reduce power consumption of a memory system by replacing a volatile memory (SRAM and DRAM) constituting the memory system mounted in electronic devices such as computers, mobile phones, and digital cameras with a nonvolatile memory is under way. According to the technology, data will not disappear after power is turned off and thus, for example, power consumption during standby excluding the data processing time can be reduced to almost zero.

A leading candidate for a nonvolatile semiconductor memory in place of a volatile memory in a memory system is a magnetic random access memory (MRAM). This is because, when compared with other nonvolatile semiconductor memories, the magnetic random access memory excels at memory characteristics such as high-speed operation and the number of times of data rewritability.

On the other hand, depending on memory system specifications, it is desirable to use a volatile memory as a cache memory or main storage memory as before and to use the magnetic random access memory as an alternative to a storage device such as a NAND flash memory and HDD.

Thus, under the current circumstances, whether to use the magnetic random access memory as a cache memory or main storage memory, or as a storage device (file memory) is determined in accordance with memory system specifications.

For example, while it is important to seek lower power consumption during reading when the magnetic random access memory that frequently executes a read operation is developed as a cache memory or main storage memory, it is important to seek lower power consumption during writing if the magnetic random access memory is developed as a storage device.

Therefore, when the magnetic random access memory is developed as an alternative to a cache memory or main storage memory, if the magnetic random access memory is used as a storage device, a problem of increased power consumption during writing is caused. Conversely, when the magnetic random access memory is developed as an alternative to a storage device, if the magnetic random access memory is used as a cache memory or main storage memory, a problem of increased power consumption during reading is caused.

BRIEF DESCRIPTION OF THE DRAWINGS

FIG. 1 is a diagram showing a magnetic random access memory;

FIGS. 2 and 3 are diagrams showing a memory cell array, write circuit, and read circuit;

FIG. 4 is a diagram showing a comparison circuit;

FIG. 5 is a diagram showing a data inversion circuit on a writing side;

FIG. 7 is a diagram showing a data inversion circuit on a reading side;

FIGS. 10A and 10B are waveform charts showing a write operation;

FIG. 11 is a diagram showing a mask control signal generation circuit; and

FIG. 12 is a diagram showing a memory system.

DETAILED DESCRIPTION

Figure 2:
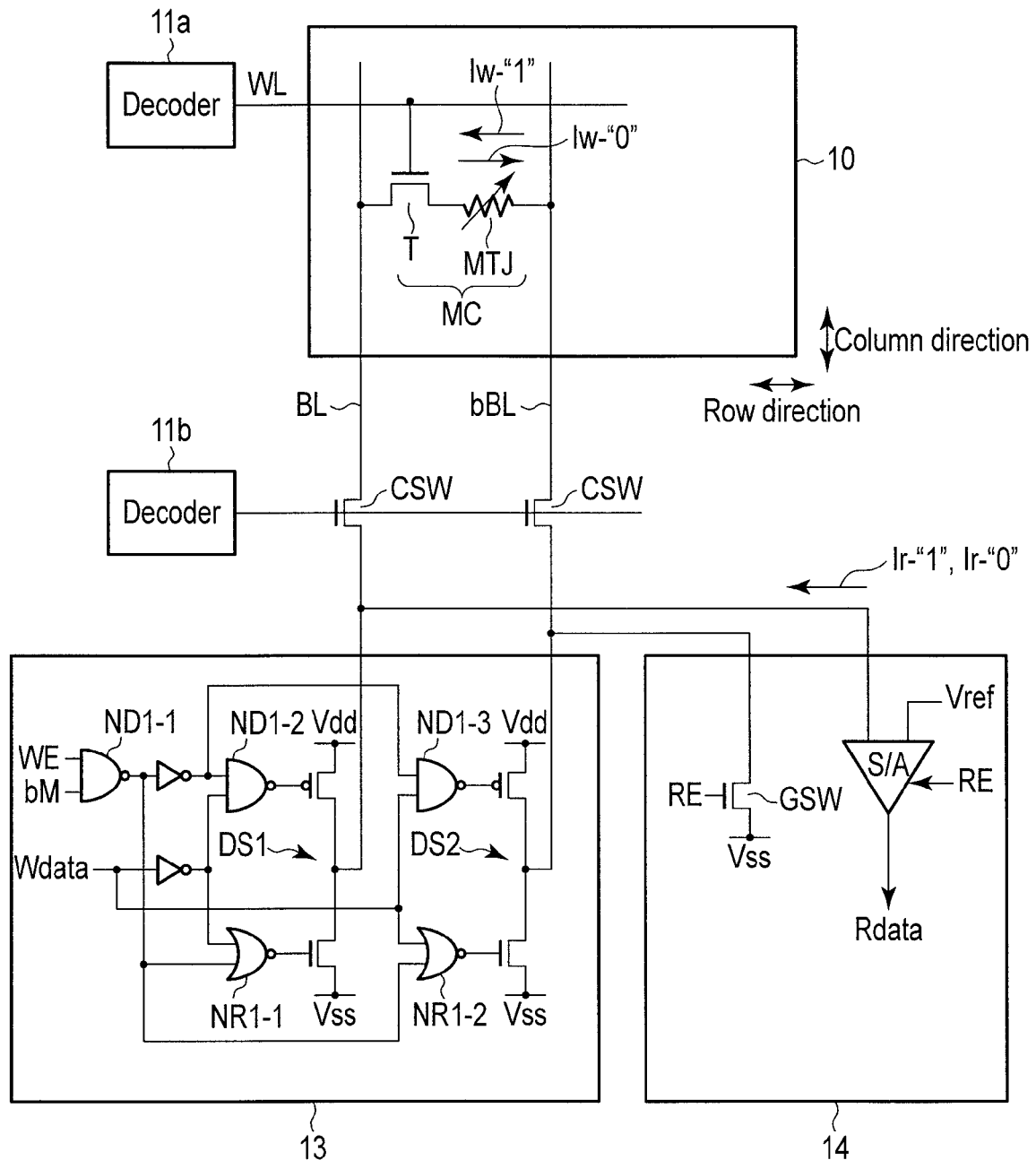

In general, according to one embodiment, a magnetic random access memory comprises: magnetoresistive elements capable of storing one of a first resistance value and a second resistance value that is different from the first resistance value; a write circuit to write s-bit (s is a natural number equal to 2 or greater) write data to the magnetoresistive elements, the write data supplied from a buffer memory; a read circuit to read s-bit read data from the magnetoresistive elements; and a control circuit that is configured to: select one of first and second modes based on a mode selection signal; control the read circuit so that the read circuit reads the read data and control the write circuit so that the write circuit writes one of the write data and inversion data of the write data to the magnetoresistive elements by the write circuit based on the read data and the write data, if free space of the buffer memory is equal to a fixed value or more when the second mode is selected; and control the write circuit so that the write circuit writes one of the write data and the inversion data of the write data to the magnetoresistive elements, the one of the write data and the inversion data corresponding to a relation that a number of bits setting the magnetoresistive elements to the first resistance value is larger than a number of bits setting the magnetoresistive elements to the second resistance value, if the free space of the buffer memory is less than the fixed value when the second mode is selected.

An embodiment will be described below with reference to the drawings.

[Overview]

First, the following definitions are provided to make the description that follows easier to understand. However, the following definitions are intended to make the description of the embodiment easier to understand and are not to be interpreted as limiting to the above definitions.

A magnetoresistive element as a memory cell of a magnetic random access memory stores one bit (binary) of a high-resistance state (first value) and a low-resistance state (second value). The high-resistance state is assumed to be a "1" state and the low-resistance state is assumed to be a "0" state. In the initial state of the magnetic random access memory, all memory cells are assumed to be in the "1" state.

A read current passed to the magnetoresistive element during reading depends on the resistance state of the magnetoresistive element. That is, if the read current when the magnetoresistive element is in the "1" state is Ir-"1" and the read current when the magnetoresistive element is in the "0" state is Ir-"0", the magnetoresistive element has a relationship Ir-"1"<Ir-"0".

A write current passed to the magnetoresistive element during writing is a two-way current whose direction changes depending on the write data value "1"/"0" and also has a value sufficiently larger than the value of the read current. That is, when one read operation and one write operation are compared, power consumption during writing becomes larger than power consumption during reading.

Further, "1"-writing and "0"-writing exist as writing to the magnetoresistive element. That is, when speaking of writing, four types of writing that change the resistance state of the magnetoresistive element exist like "1"->"1", "1"->"0", "0"->"1", and "0"->"0". However, when simply speaking of writing, among these four types, writing that changes the resistance state of the magnetoresistive element ("1"->"0" and "0"->"1") is assumed to be meant.

Under the above assumption, a magnetic random access memory according to an embodiment will be described.

A magnetic random access memory according to the embodiment is characterized in that the use mainly focused on lower power consumption during reading (for example, the use as a cache memory or main storage memory) and the use mainly focused on lower power consumption during writing (for example, the use as a storage device) can be switched.

The magnetic random access memory is also characterized in that, in addition to being switchable between two uses, the write operation most appropriate to lower power consumption is executed in each use.

For example, when the magnetic random access memory is used as a storage device (file memory), a write operation capable of reducing power consumption during writing is adopted (Write optimize).

This is because when the magnetic random access memory is used as a storage device, data stored in the magnetoresistive element is not read frequently and is read only when the user makes a request to read data. In this case, if the above characteristic of the magnetic random access memory that power consumption during writing is larger than power consumption during reading is considered, mainly reducing power consumption during writing leads to the reduction of power consumption in the memory system as a whole.

A technique to reduce the number of write bits (number of bits that change the resistance) by reading the resistance state (data "1"/"0") at the physical address (memory cell) to be overwritten with write data, comparing the read data and the write data, and inhibiting writing of matching bits is adopted as a technology to reduce power consumption during writing.

For example, write data is assumed to be written in s bits (s is a natural number equal to 2 or greater).

In this case, the number of mutually matching bits of s-bit read data read from the physical address to be overwritten with write data and s-bit write data is set as n1 and the number of mutually matching bits of s-bit read data and inversion data of s-bit write data is set as n2.

Then, if n1>n2, mask processing to inhibit writing of mutually matching bits and then a write operation of, among s bits as write data, mutually mismatching bits is executed.

If n1<n2, mask processing to inhibit writing of mutually matching bits and then a write operation of, among s bits as inversion data of the write data, mutually mismatching bits is executed.

A detailed write operation (Write optimize) for use as a storage device will be described in the following embodiment.

When the magnetic random access memory is used as a cache memory or main storage memory, by contrast, a write operation capable of reducing power consumption during reading is adopted (Read optimize).

This is because when the magnetic random access memory is used as a cache memory or main storage memory, data stored in the magnetoresistive element is read frequently. In this case, even if the above characteristic of the magnetic random access memory that power consumption during writing is larger than power consumption during reading is considered, mainly reducing power consumption during reading leads to the reduction of power consumption in the memory system as a whole because the number of times of reading is extremely larger than the number of times of writing.

A technique that controls writing so that a large number of "1" are written to the physical address (memory cell) to be overwritten with write data by setting bits of write data to a state in which the number of "1" is large is adopted as a technology to reduce power consumption during reading.

In this case, more magnetoresistive elements storing write data are in the "1" state (high-resistance state) and thus, the number of magnetoresistive elements passing the small read current Ir-"1" is larger than the number of magnetoresistive elements passing the large read current Ir-"0" during reading. As a result, lower power consumption during reading can be achieved.

For example, among s bits (s is a natural number equal to 2 or greater) as write data, the number of bits where the magnetoresistive element is set to the first resistance value (high-resistance state) is set as m1 and the number of bits where the magnetoresistive element is set to the second resistance value (low-resistance state) is set as m2.

Then, if m1>m2, a write operation to write s bits as write data to s magnetoresistive elements present at the selected physical address is executed.

If m1<m2, a write operation to write s bits as inversion data of write data to s magnetoresistive elements present at the selected physical address is executed.

A detailed write operation (Read optimize) for use as a cache memory or main storage memory will be described in the following embodiment.

[Embodiment]

FIG. 1 shows principal portions of a magnetic random access memory.

Memory cell array 10 includes an array of magnetoresistive elements (memory cells). Decoder 11 randomly accesses magnetoresistive elements in memory cell array 10 based on address signal ADDRESS_IN.

Write data DATA_IN is input into data inversion circuit 12. Data inversion circuit 12 has, for example, a function to transfer s-bit (s is a natural number equal to 2 or greater) write data DATA_IN to write circuit 13 as write data Wdata unchanged and a function to transfer inversion data obtained by inverting the value of each bit of s-bit write data DATA_IN to write circuit 13 as write data Wdata.

Write circuit 13 has a function to write write data Wdata to selected magnetoresistive elements in memory cell array 11.

Read circuit 14 has a function to read read data Rdata from selected magnetoresistive elements in memory cell array 11.

Read data Rdata is input into data inversion circuit 15. Data inversion circuit 15 has, for example, a function to output s-bit (s is a natural number equal to 2 or greater) read data Rdata as read data DATA_OUT unchanged and a function to output inversion data obtained by inverting the value of each bit of s-bit read data Rdata as read data DATA_OUT.

Comparison circuit 16 has a function to mutually compare write data DATA_IN and read data Rdata read from the selected physical address to be overwritten with write data DATA_IN. More specifically, comparison circuit 16 has at least one of the following functions:

Function to mutually compare write data DATA_IN and read data Rdata

Function to mutually compare inversion data of write data DATA_IN and read data Rdata Function to mutually compare write data DATA_IN and inversion data of read data Rdata Function to mutually compare inversion data of write data DATA_IN and inversion data of read data Rdata Then, comparison circuit 16 outputs inversion control signal COM and mask control signal M based on a comparison result of write data DATA_IN and read data Rdata.

Inversion control signal COM is a control signal that determines whether to invert write data DATA_IN in data inversion circuit 12 and mask control signal M is a control signal that inhibits writing of mutually matching bits of write data DATA_IN and read data Rdata in write circuit 13.

Control circuit 17 controls operations of decoder 11, data inversion circuit 12, write circuit 13, read circuit 14, data inversion circuit 15, and comparison circuit 16 based on write enable signal WE, read enable signal RE, mask enable signal ME, mode selection signal φ1, and policy selection signal φ2.

Write enable signal WE is enabled during writing and read enable signal RE is enabled during reading. Mask enable signal ME is enabled when mask processing to inhibit writing of mutually matching bits of write data DATA_IN and read data Rdata is executed.

Mode selection signal φ1 is a control signal to selectively switch a first mode used as a cache memory or main storage memory and a second mode for use as a storage device.

Policy selection signal φ2 determines whether to write write data Wdata in a state in which the number of "1" is large or in a state in which the number of "0" is large when the first mode is selected.

To bias write data Wdata to a state in which the number of "1" or "0" is large, for example, whether to transfer write data DATA_IN to write circuit 13 as write data Wdata unchanged or to transfer inversion data obtained by inverting each bit of write data DATA_IN to write circuit 13 as write data Wdata is controlled.

FIG. 2 shows a first example of a memory cell array, write circuit, and read circuit.

Memory cell MC in memory cell array 10 includes magnetoresistive element MTJ and selection transistor (FET) T connected in series. A gate terminal of the selection transistor is connected to word line WL. Word line WL extends in a row direction and one end thereof is connected to row decoder 11a.

One end of memory cell MC is connected to bit line BL and the other end is connected to bit line bBL. Both of bit lines BL, bBL extend in a column direction and one end thereof is connected to write circuit 13 and read circuit 14 via column selection transistor (FET) CSW.

The gate terminal of column selection transistor CSW is connected to column decoder 11b.

Write circuit 13 includes write drivers/sinkers DS1, DS2. Write driver/sinker DS1 is connected to one end of bit line BL and write driver/sinker DS2 is connected to one end of bit line bBL.

Write drivers/sinkers DS1, DS2 also include, for example, P channel FET and N channel FET connected in series between power terminal Vdd and ground terminal Vss.

Then, when write enable signal WE is "H" and inversion signal bM of mask control signal M is "H", the output signal of NAND gate circuit ND1-1 is "L" and thus, NAND gate circuits ND1-2, ND1-3 and NOR gate circuits NR1-1, NR1-2 output output signals in accordance with the value of write data Wdata.

When, for example, write data Wdata is "1", the output signal of NAND gate circuit ND1-2 and that of NOR gate circuit NR1-1 both become "1". Thus, write driver/sinker DS1 connects bit line BL to ground terminal Vss. Further, the output signal of NAND gate circuit ND1-3 and that of NOR gate circuit NR1-2 both become "0". Thus, write driver/sinker DS2 connects bit line bBL to power terminal Vdd.

Therefore, write current Iw-"1" in a direction from driver/sinker DS2 toward driver/sinker DS1 flows to magnetoresistive element MTJ.

When, for example, write data Wdata is "0", the output signal of NAND gate circuit ND1-2 and that of NOR gate circuit NR1-1 both become "0". Thus, write driver/sinker DS1 connects bit line BL to power terminal Vdd. Further, the output signal of NAND gate circuit ND1-3 and that of NOR gate circuit NR1-2 both become "1". Thus, write driver/sinker DS2 connects bit line bBL to ground terminal Vss.

Therefore, write current Iw-"0" in a direction from driver/sinker DS1 toward driver/sinker DS2 flows to magnetoresistive element MTJ.

In contrast, when write enable signal WE is "L", or when write enable signal WE is "H", but inversion signal bM of mask control signal M is "L", the output signal of NAND gate circuit ND1-1 is "H" and thus, the output signal of NAND gate circuits ND1-2, ND1-3 is always "1" regardless of the value of write data Wdata and the output signal of NOR gate circuits NR1-1, NR1-2 is always "0" regardless of the value of write data Wdata.

Therefore, drivers/sinkers DS1, DS2 are inactivated and no write current will flow to magnetoresistive element MTJ.

Thus, being able to control activation/inactivation of drivers/sinkers DS1, DS2 in accordance with the value of mask control signal M means that lower power consumption can be achieved by inhibiting writing (mask processing) of mutually matching bits of write data DATA_IN and read data Rdata (writing "1"->"1" and "0"->"0" that does not change the resistance) by setting inversion signal bM of mask control signal M to "L".

Read circuit 14 includes, for example, ground transistor (FET) GSW connected to bit line bBL and sense amplifier S/A connected to bit line BL.

However, the physical relationship of ground transistor GSW and sense amplifier S/A may be reversed. That is, ground transistor (FET) GSW may be connected to bit line BL and sense amplifier S/A may be connected to bit line bBL.

When, for example, read enable signal RE is "H", ground transistor GSW is turned on and sense amplifier S/A is activated.

Therefore, read data Rdata can be read from magnetoresistive element MTJ by, for example, detecting read currents Ir-"0", Ir-"1" flowing to magnetoresistive element MTJ by using sense amplifier S/A.

In the present example, it is assumed that data "1" corresponds to logic "H" and data "0" corresponds to logic "L", but the relationship between data "1"/"0" and logic "H"/"L" is not limited to the above example and a reversed relationship may also be adopted.

In such a case, the circuit in FIG. 2 can be adopted unchanged if Wdata in FIG. 2 is replaced by bWdata. bWdata is an inversion signal of Wdata.

FIG. 3 shows a second example of the memory cell array, write circuit, and read circuit.

When compared with the first example shown in FIG. 2, the present example is different in the configuration of write circuit 13.

Write circuit 13 includes write drivers/sinkers DS1, DS2. Write driver/sinker DS1 is connected to one end of bit line BL and write driver/sinker DS2 is connected to one end of bit line bBL.

Write drivers/sinkers DS1, DS2 also include, for example, two P channels FET and two N channels FET connected in series between power terminal Vdd and ground terminal Vss.

According to the present example, write drivers/sinkers DS1, DS2 include two P channels FET and two N channels FET and thus, the wiring connection of a signal to control write drivers/sinkers DS1, DS2 can advantageously be made easier. However, two FETs are arranged between power terminal Vdd and bit line BL and the voltage drop increases and thus, if the voltage drop should be decreased, it is desirable to adopt the first example shown in FIG. 2.

According to the present example, when write enable signal WE is "H" and inversion signal bM of mask control signal M is "H", the output signal of NAND gate circuit N1 becomes "L" and drivers/sinkers DS1, DS2 are activated.

Therefore, write current Iw-"1" in a direction from driver/sinker DS2 toward driver/sinker DS1 flows to magnetoresistive element MTJ when write data Wdata is "1" and write current Iw-"0" in a direction from driver/sinker DS1 toward driver/sinker DS2 flows to magnetoresistive element MTJ when write data Wdata is "0".

Further, for example, when write enable signal WE is "L", or write enable signal WE is "H", but inversion signal bM of mask control signal M is "L", the output signal of NAND gate circuit N1 becomes "H" and drivers/sinkers DS1, DS2 are inactivated.

That is, for example, lower power consumption can be achieved by inhibiting writing (mask processing) of mutually matching bits of write data DATA_IN and read data Rdata (writing "1"->"1" and "0"->"0" that does not change the resistance) by setting inversion signal bM of mask control signal M to "L".

Read circuit 14 includes, for example, ground transistor (FET) GSW connected to bit line bBL and sense amplifier S/A connected to bit line BL.

However, the physical relationship of ground transistor GSW and sense amplifier S/A may be reversed. That is, ground transistor (FET) GSW may be connected to bit line BL and sense amplifier S/A may be connected to bit line bBL.

When, for example, read enable signal RE is "H", ground transistor GSW is turned on and sense amplifier S/A is activated.

Therefore, read data Rdata can be read from magnetoresistive element MTJ by, for example, detecting read currents Ir-"0", Ir-"1" flowing to magnetoresistive element MTJ by using sense amplifier S/A.

Also in the present example, it is assumed that data "1" corresponds to logic "H" and data "0" corresponds to logic "L", but the relationship of data "1"/"0" and logic "H"/"L" is not limited to the above example and a reversed relationship may be adopted.

In such a case, the circuit in FIG. 3 can be adopted unchanged if Wdata in FIG. 3 is replaced by bWdata. bWdata is an inversion signal of Wdata.

FIG. 4 shows a comparison circuit.

Comparison circuit 16 compares matching/mismatching of write data DATA_IN and read data Rdata bit by bit. The present example shows an example of the comparison circuit that obtains 1-bit COMP[0] by comparing 1-bit DATA_IN[0] and 1-bit Rdata[0]. Therefore, to compare s-bit data, for example, s-bit data is simultaneously compared by using circuits in FIG. 4.

Comparison circuit 16 includes NAND gate circuit ND2 and NOR gate circuits NR2-1, NR2-2. The circuit is equivalent to an exclusive OR circuit. That is, comparison circuit 16 has a function to detect the number of matching bits or the number of mismatching bits by comparing s-bit write data DATA_IN[0:S−1] and s-bit read data Rdata[0:S−1] bit by bit.

If, for example, write data (1-bit) DATA_IN[0] and read data (1-bit) Rdata[0] match, comparison signal COMP[0] becomes "0".

That is, when DATA_IN[0]="1" and Rdata[0]="1", the output signal of NAND gate circuit ND2 becomes "0" and the output signal of NOR gate circuit NR2-1 becomes "0" and thus, comparison signal COMP[0] output from NOR gate circuit NR2-2 becomes "0". Further, when DATA_IN[0]="0" and Rdata[0]="0", the output signal of NAND gate circuit ND2 becomes "1" and the output signal of NOR gate circuit NR2-1 becomes "1" and thus, comparison signal COMP[0] output from NOR gate circuit NR2-2 becomes "0".

If write data (1-bit) DATA_IN[0] and read data (1-bit) Rdata[0] mismatch, by contrast, comparison signal COMP[0] becomes "1".

That is, when DATA_IN[0]="1" and Rdata[0]="0", the output signal of NAND gate circuit ND2 becomes "1" and the output signal of NOR gate circuit NR2-1 becomes "0" and thus, comparison signal COMP[0] output from NOR gate circuit NR2-2 becomes "1". Further, when DATA_IN[0]="0" and Rdata[0]="1", the output signal of NAND gate circuit ND2 becomes "1" and the output signal of NOR gate circuit NR2-1 becomes "0" and thus, comparison signal COMP[0] output from NOR gate circuit NR2-2 becomes "1".

FIG. 5 shows a data inversion circuit on a writing side.

Data inversion circuit 12 includes "1"/"0" counting circuit 19. "1"/"0" counting circuit 19 counts the number of bits in the "1" state, the number of bits in the "0" state, or the numbers of bits in the "1" state and the "0" state of write data DATA_IN[0:S-1] or comparison signal COMP[0:S−1] under the control of mode selection signal φ1 and policy selection signal φ2.

TABLE 1

| Mode | | Mode selection signal φ1 | Policy selection signal φ2 | Comparison result | Control signal CNT | Write control operation |
|---|---|---|---|---|---|---|
| Case of using as chache memory (Read optimize) | First mode | "L" | "L" | Number of "0" is large | "H" | Write write data with no change |
| | | | | Number of "1" is large | "L" | Write inversion data of write data |
| | | | "H" | Number of "1" is large | "H" | Write write data with no change |
| | | | | Number of "0" is large | "L" | Write inversion data of write data |
| Case of using as storage device (Write optimize) | Second mode | "H" | "L" | Number of "0" (congruous bit) is large | "H" | Write after mask processing of write data |
| | | | | Number of "1" (incongruous bit) is large | "L" | Write after mask processing of inversion |

TABLE 1-continued

| Mode | Mode selection signal φ1 | Policy selection signal φ2 | Comparison result | Control signal CNT | Write control operation |
|------|--------------------------|----------------------------|-------------------|--------------------|-------------------------|
| | | "H" | Number of "1" (incongruous bit) is large | "H" | data of write data Write after mask processing of write data |
| | | | Number of "0" (congruous bit) is large | "L" | Write after mask processing of inversion data of write data |

If, for example, the second mode for use as a storage device is selected, as shown in Table 1, mode selection signal φ1 is set to "H" and inversion signal bφ1 of mode selection signal φ1 is set to "L".

In this case, comparison signal COMP[0:S−1] is input into "1"/"0" counting circuit 19. That is, "1"/"0" counting circuit 19 counts the number of "1", the number of "0", or both numbers of comparison signal COMP[0:S−1] based on policy selection signal φ2.

For example, when policy selection signal φ2 is "L", the number of "0" in comparison signal COMP[0:S−1] is counted. If the comparison circuit in FIG. 4 is assumed, this means counting the number of matching bits because write data DATA_IN [i] and read data Rdata [i] match when comparison signal COMP [i] is "0".

Therefore, if "1"/"0" counting circuit 19 determines that the number of "0" is large (the number of matching bits of both is large), "H" is output as control signal CNT.

At this point, transfer transistor Q11 in selector SEL1 is turned on and transfer transistor Q12 is turned off and thus, selector SEL1 transfers write data DATA_IN[0] to write circuit 13 as write data Wdata[0] unchanged.

In the present example, it is assumed that one selector SEL1 is provided for 1-bit write data DATA_IN[0]. Therefore, to output s-bit write data DATA_IN[0:S−1] as s-bit write data Wdata[0:S−1], for example, s selectors from the circuit in FIG. 5 are used to transfer s-bit data. This also applies below.

If "1"/"0" counting circuit 19 determines that the number of "1" is large (the number of mismatching bits of both is large), by contrast, "L" is output as control signal CNT.

At this point, transfer transistor Q11 in selector SEL1 is turned off and transfer transistor Q12 is turned on and thus, selector SEL1 transfers inversion data of write data DATA_IN to write circuit 13 as write data Wdata.

For example, when policy selection signal φ2 is "H", the number of "1" in comparison signal COMP[0:S−1] is counted. If the comparison circuit in FIG. 4 is assumed, this means counting the number of mismatching bits because write data DATA_IN [i] and read data Rdata [i] match when comparison signal COMP [i] is "0".

Therefore, if "1"/"0" counting circuit 19 determines that the number of "1" is large (the number of mismatching bits of both is large), "H" is output as control signal CNT.

At this point, transfer transistor Q11 in selector SEL1 is turned on and transfer transistor Q12 is turned off and thus, selector SEL1 transfers write data DATA_IN[0] to write circuit 13 as write data Wdata[0] unchanged.

If "1"/"0" counting circuit 19 determines that the number of "0" is large (the number of matching bits of both is large), by contrast, "L" is output as control signal CNT.

At this point, transfer transistor Q11 in selector SEL1 is turned off and transfer transistor Q12 is turned on and thus, selector SEL1 transfers inversion data of write data DATA_IN [0] to write circuit 13 as write data Wdata[0].

When both of mode selection signal φ1 and policy selection signal φ2 are "H", inversion/non-inversion of write data DATA_IN[0] is controlled so that the number of mismatching bits becomes large as a result for writing.

However, the present embodiment has a spirit of seeking lower power consumption by increasing the number of matching bits of write data Wdata[0:S−1] and read data Rdata [0:S−1] during reading and inhibiting writing of such matching bits. Thus, it is inappropriate to set both of mode selection signal φ1 and policy selection signal φ2 to "H" from the perspective of the present embodiment.

Therefore, if, for example, mode selection signal φ1 is "H", it is desirable to always exercise control so that policy selection signal φ2 is "L".

However, when mode selection signal φ1 is "H", it is possible to make policy selection signal φ2 switchable to "H" or "L" if necessary.

Thus, if the circuits in FIGS. 4 and 5 are used, the following control can be exercised.

That is, the number of mutually matching bits of s bits as read data Rdata[0:S−1] and s bits as write data DATA_IN[0: S−1] is set as n1 and the number of mutually matching bits of s bits as read data Rdata[0:S−1] and s bits as inversion data of write data DATA_IN[0:S−1] is set as n2.

Then, if n1>n2, control signal CNT is set to "H" and mask control signal M is set to "H" (write-protected: mask processing executed) for matching bits of write data DATA_IN [i] and read data Rdata [i] of s-bit write data DATA_IN[0:S−1] and mask control signal M is set to "L" (write operation executed) for mismatching bits of write data DATA_IN [i] and read data Rdata [i].

That is, control signal CNT is "H" and thus, inversion processing of write data DATA_IN is not executed.

Mask control signal M is output bit by bit for s-bit write data DATA_IN[0:S−1]. Therefore, when both of write enable signal WE and mask enable signal ME are "H", inversion signal bM of mask control signal M becomes "L" (write-protected: mask processing executed) for matching bits of write data DATA_IN [i] and Rdata [i].

If n1<n2, control signal CNT is set to "L" and mask control signal M is set to "H" (write-protected: mask processing executed) for matching bits of inversion data of write data DATA_IN [i] and read data Rdata [i] of inversion data of s-bit write data DATA_IN[0:S−1] and mask control signal M is set to "L" (write operation executed) for mismatching bits of inversion data of write data DATA_IN [i] and read data Rdata [i].

That is, control signal CNT is "L" and thus, inversion processing of write data DATA_IN [i] is executed.

Mask control signal M is output bit by bit for s-bit write data DATA_IN[0:S−1]. Therefore, when both of write enable signal WE and mask enable signal ME are "H", inversion signal bM of mask control signal M becomes "L" (write-protected: mask processing executed) for matching bits of inversion data of write data DATA_IN [i] and Rdata [i].

If, for example, the first mode used for a cache memory or main storage memory is selected, as shown in Table 1, mode selection signal φ1 is set to "L" and inversion signal bφ1 of mode selection signal φ1 is set to "H".

In this case, write data DATA_IN [0:S−1] is input into "1"/"0" counting circuit 19. That is, "1"/"0" counting circuit 19 counts the number of "1", the number of "0", or both numbers of write data COMP[0:S-1] based on policy selection signal φ2.

If, for example, policy selection signal φ2 indicates a policy of setting write data Wdata in a state in which the number of "0" is large, that is, policy selection signal φ2 is "L", the following write control is exercised.

First, the number of bits of write data (s bits) DATA_IN[0: S−1] to which "0" that sets a magnetoresistive element to a low resistance value is set as m1 and the number of bits to which "1" that sets a magnetoresistive element to a high resistance value is set as m2.

Then, if m1>m2, "1"/"0" counting circuit 19 outputs "H" as control signal CNT to write s bits as write data DATA_IN [0:S−1] to s magnetoresistive elements present at the selected physical address unchanged.

Therefore, transfer transistor Q11 in selector SEL1 is turned on and transfer transistor Q12 is turned off and thus, selector SEL1 transfers write data DATA_IN[0:S−1] in which the number of "0" is large to write circuit 13 as write data Wdata[0:S−1] unchanged.

If m1<m2, "1"/"0" counting circuit 19 outputs "L" as control signal CNT to write s bits as inversion data of write data DATA_IN[0:S−1] to s magnetoresistive elements present at the selected physical address.

Therefore, transfer transistor Q11 in selector SEL1 is turned off and transfer transistor Q12 is turned on and thus, selector SEL1 inverts write data DATA_IN[0:S−1] in which the number of "1" is large into data in which the number of "0" is large and transfers the data to write circuit 13 as write data Wdata[0:S−1].

If, for example, policy selection signal φ2 indicates a policy of setting write data Wdata[0:S−1] in a state in which the number of "1" is large, that is, policy selection signal φ2 is "H", the following write control is exercised.

First, the number of bits of write data (s bits) DATA_IN[0: S−1] to which "1" that sets a magnetoresistive element to a high resistance value is set as m1 and the number of bits to which "0" that sets a magnetoresistive element to a low resistance value is set as m2.

Then, if m1>m2, "1"/"0" counting circuit 19 outputs "H" as control signal CNT to write s bits as write data DATA_IN [0:S−1] to s magnetoresistive elements present at the selected physical address unchanged.

Therefore, transfer transistor Q11 in selector SEL1 is turned on and transfer transistor Q12 is turned off and thus, selector SEL1 transfers write data DATA_IN[0:S−1] in which the number of "1" is large to write circuit 13 as write data Wdata[0:S−1] unchanged.

If m1<m2, "1"/"0" counting circuit 19 outputs "L" as control signal CNT to write s bits as inversion data of write data DATA_IN[0:S−1] to s magnetoresistive elements present at the selected physical address.

Therefore, transfer transistor Q11 in selector SEL1 is turned off and transfer transistor Q12 is turned on and thus, selector SEL1 inverts write data DATA_IN[0:S−1] in which the number of "0" is large into data in which the number of "1" is large and transfers the data to write circuit 13 as write data Wdata[0:S−1].

Figure 6:
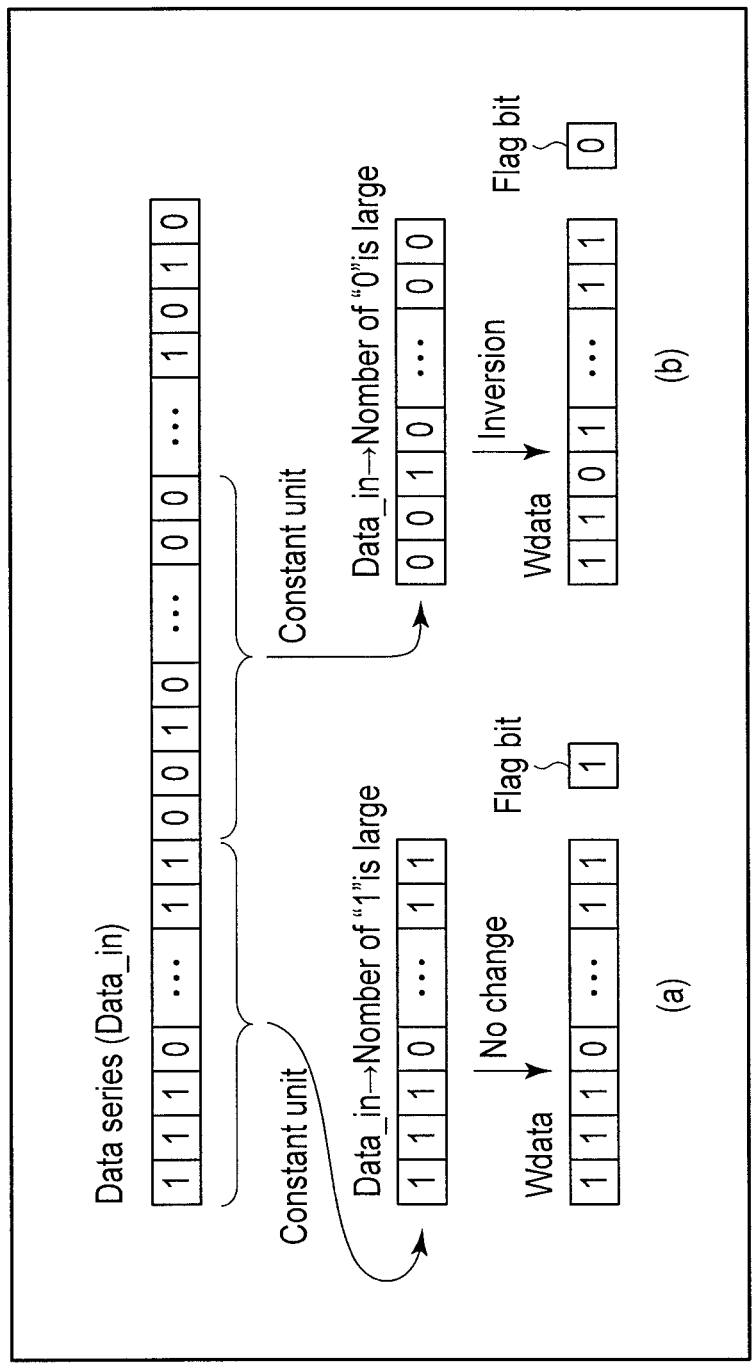
FIG. 6 is a diagram showing write data and flag bits.

Here, as shown in FIG. 6, a flag bit to indicate whether or not write data DATA_IN has been inverted in first or second mode is added to write data Wdata.

This is intended to correctly read write data DATA_IN as read data DATA_OUT during reading by explicitly indicating whether write data Wdata is write data DATA_IN itself or data obtained by inverting write data DATA_IN.

For example, a case when the second mode is selected is taken as an example.

First, write data (data series) DATA_IN is divided data in constant units. Then, the number of bits in the "1" state and the number of bits in the "0" state of write data (s bits) DATA_IN in constant units are counted.

If policy selection signal φ2 indicates a policy of setting write data Wdata in a state in which the number of "1" is large and s-bit write data DATA_IN is in a state in which the number of "1" is large, for example, the flag bit is set to "1" to indicate that write data DATA_IN is written as write data Wdata unchanged (see FIG. 6A).

In contrast, if policy selection signal p2 indicates a policy of setting write data Wdata in a state in which the number of "1" is large and s-bit write data DATA_IN is in a state in which the number of "0" is large, for example, the flag bit is set to "0" to indicate that write data Wdata is data obtained by inverting write data DATA_IN (see FIG. 6B).

Accordingly, by considering the flag bit during reading, whether to set data read from a memory cell array as read data unchanged or data obtained by inverting data read from a memory cell array as read data can be determined.

FIG. 7 shows a data inversion circuit on a reading side.

Data inversion circuit 15 includes flag detection circuit 20.

Flag detection circuit 20 determines whether to output s-bit read data Rdata read from s magnetoresistive elements in a memory cell array as read data DATA_OUT unchanged or inversion data of s-bit read data Rdata as read data DATA_OUT based on the flag bit.

If, for example, the second mode for use as a storage device is selected and s-bit write data DATA_IN satisfies n1>n2, the flag bit is set to "1" as the first value. In this case, if the flag bit is "1" in the reading operation after the second mode, flag detection circuit 20 outputs "H".

If the output signal of flag detection circuit 20 is "H", transfer transistor Q21 in selector SEL2 is turned on and transfer transistor Q22 is turned off. Therefore, selector SEL2 outputs s-bit read data Rdata from the memory cell array as read data DATA_OUT unchanged.

If the second mode is selected and s-bit write data DATA_IN satisfies n1<n2, the flag bit is set to "0" as the second value. In this case, if the flag bit is "0" in the reading operation after the second mode, flag detection circuit 20 outputs "L".

If the output signal of flag detection circuit 20 is "L", transfer transistor Q21 in selector SEL2 is turned off and transfer transistor Q22 is turned on. Therefore, selector SEL2 outputs read data DATA_OUT as inversion data of s-bit read data Rdata from the memory cell array.

If the first mode used as a cache memory or main storage memory is selected and s-bit write data DATA_IN satisfies m1>m2, the flag bit is set to "1" as the first value. In this case, if the flag bit is "1" in the reading operation after the first mode, flag detection circuit 20 outputs "H".

If the output signal of flag detection circuit 20 is "H", transfer transistor Q21 in selector SEL2 is turned on and transfer transistor Q22 is turned off. Therefore, selector SEL2 outputs s-bit read data Rdata from the memory cell array as read data DATA_OUT unchanged.

If the first mode is selected and s-bit write data DATA_IN satisfies m1<m2, the flag bit is set to "0" as the second value. In this case, if the flag bit is "0" in the reading operation after the first mode, flag detection circuit 20 outputs "L".

If the output signal of flag detection circuit 20 is "L", transfer transistor Q21 in selector SEL2 is turned off and transfer transistor Q22 is turned on. Therefore, selector SEL2 outputs read data DATA_OUT as inversion data of s-bit read data Rdata from the memory cell array.

Figure 8:
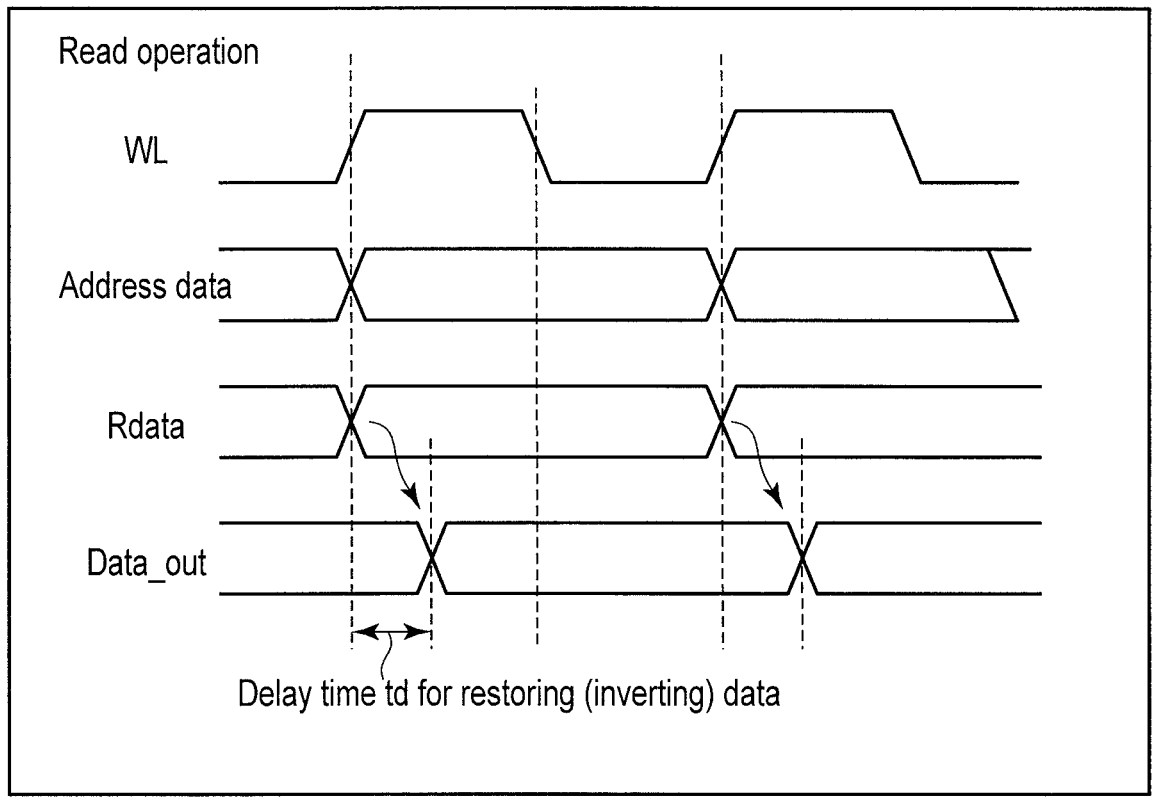
FIG. 8 is a waveform chart showing a read operation.

FIG. 8 shows a waveform chart when inversion data of read data Rdata is output as read data DATA_OUT.

In this case, read data DATA_OUT is generated by inverting read data Rdata and thus, delay time td for restoring (inverting) data arises.

Figure 9:
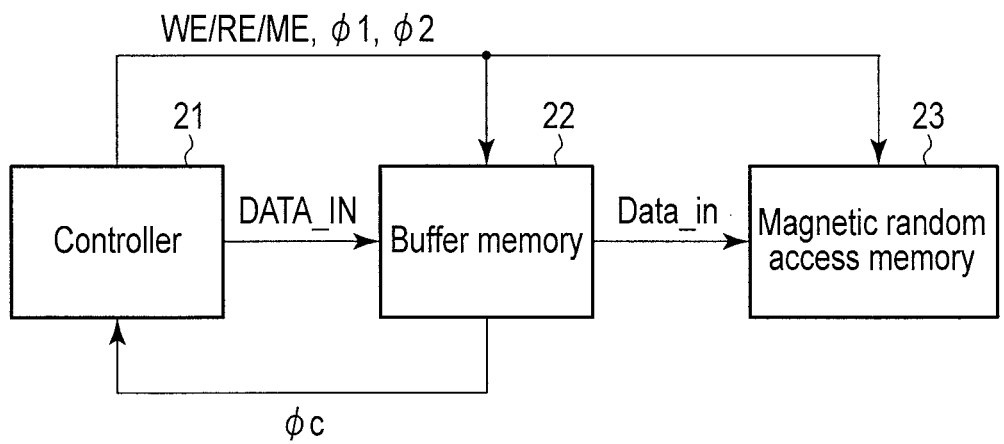
FIG. 9 is a diagram showing a memory system.

FIG. 9 shows a memory system including a magnetic random access memory.

Controller 21 controls operations of buffer memory (write buffer) 22 and magnetic random access memory 23. Magnetic random access memory 23 is a magnetic random access memory according to the above embodiment.

The memory system includes a data path connected to magnetic random access memory 23 from controller 21 via buffer memory (for example, DRAM or the like) 22 as a data path of write data DATA_IN.

When magnetic random access memory 23 is used as a storage device, controller 21 supplies mode selection signal φ1 that selects the second mode for use as a storage device to the magnetic random access memory.

The following function can be added to controller 21.

The function is a function to select a third mode in place of the second mode based on free space of buffer memory 22.

For example, controller 21 determines free space of buffer memory 22 based on free space signal φc indicating free space of buffer memory 22.

Then, if the free space of buffer memory 22 is equal to a fixed value or more, controller 21 supplies mode selection signal φ1 instructing the selection of the second mode to magnetic random access memory 23.

If the free space of buffer memory 22 is less than a fixed value, controller 21 supplies mode selection signal φ1 instructing the selection of the third mode in place of the second mode to magnetic random access memory 23.

A control circuit (control circuit 17 in FIG. 1) in magnetic random access memory 23 sets the number of bits where the magnetoresistive element is set to the first resistance value (high-resistance state) is set as m1 and the number of bits where the magnetoresistive element is set to the second resistance value (low-resistance state) is set as m2 when the third mode is selected by mode selection signal φ1, among s bits as write data DATA_IN.

Then, if m1>m2, the control circuit executes a write operation to write s bits as write data DATA_IN to s magnetoresistive elements present at the selected physical address.

If m1<m2, the control circuit executes a write operation to write s bits as inversion data of write data DATA_IN to s magnetoresistive elements present at the selected physical address.

Thus, when the magnetic random access memory is used as a storage device, if free space of buffer memory 22 is sufficiently secured, the number of write bits (number of bits whose resistance is changed) is reduced by selecting the second mode, reading data of memory cells to be overwritten with write data, comparing the read data and the write data, and inhibiting writing of matching bits of both. Accordingly, lower power consumption during writing can be realized.

Incidentally, when a write operation is executed in second mode, as is evident, for example, from the waveform chart shown in FIG. 10B, data always has to be read (pre-read) before execution of data writing. Thus, delay time (overhead) td to compare bits and invert data in magnetic random access memory 23 arises so that the write time (one cycle) to actually write data to a physical address (memory cell) becomes longer.

On the other hand, the write time to write write data DATA_IN from controller 21 to buffer memory 22 in second mode is sufficiently shorter than the write time in magnetic random access memory 23. Thus, free space of buffer memory 22 is easily estimated to gradually decrease in second mode.

In this case, if sufficient free space of buffer memory 22 is secured, data can be written at high speed from controller 21 to buffer memory 22 in short latency so that the write operation in second mode can be continued.

However, if sufficient free space of buffer memory 22 is not secured, it is necessary to wait to write from controller 21 to buffer memory 22 until sufficient free space of the buffer memory is secured and thus, the write latency becomes longer, which affects the memory system adversely.

Thus, when the magnetic random access memory is used as a storage device, if sufficient free space of buffer memory 22 is not secured, the third mode is selected in place of the second mode.

The write operation in third mode is the same as the write operation in first mode for use as a cache memory and write data and read data are not compared and thus, data can be written at high speed. That is, in third mode, inversion/non-inversion of s-bit write data DATA_IN may be controlled based on policy selection signal φ2 so that, for example, a condition that the number of "1" increases is satisfied.

As is evident from, for example, the waveform chart shown in FIG. 10A, delay time td for data inversion necessary to generate write data Wdata from write data DATA_IN is short.

Thus, by changing from the second mode to the third mode based on free space of buffer memory 22 for use as a storage device, circumstances like being unable to write from controller 21 to buffer memory 22 due to zero free space of buffer memory 22 can be avoided.

The write operation in the present embodiment will be summarized with reference to Table 2.

TABLE 2

| Mode | Mode | State of buffer memory | State of DATA_IN | Write control operation |
|---|---|---|---|---|
| Case of using as chache memory (Read optimize) | First mode | | m1 > m2 | Write write data with no change |
| | | | m1 < m2 | Write inversion data of write data |
| Case of using as storage device (Write optimize) | Second mode | C-buffer ≥ Nb | n1 > n2 | Write after mask processing of write data |
| | | | n1 < n2 | Write after mask processing of inversion data of write data |
| | Third mode | C-buffer < Nb | m1 > m2 | Write write data with no change |
| | | | m1 < m2 | Write inversion data of write data |

The first mode is selected when the magnetic random access memory is used as a cache memory or main storage memory (Read optimize).

In first mode, the state of write data DATA_IN is determined, the number of bits where the magnetoresistive element is set to the "1" state is set as m1, the number of bits where the magnetoresistive element is set to the "0" state is set as m2, write data is written unchanged if m1>m2, and inversion data of write data is written if m1<m2.

The second mode is selected when the magnetic random access memory is used as a storage device (Write optimize) under the condition that free space C-buffer of the buffer memory is equal to fixed value Nb or more.

In second mode, the number of mutually matching bits of read data and write data is set as n1 and the number of mutually matching bits of read data and inversion data of write data is set as n2. Then, if n1>n2, mask processing to inhibit writing of mutually matching bits regarding write data and then a write operation of mutually mismatching bits is executed. If n1<n2, mask processing to inhibit writing of mutually matching bits regarding inversion data of write data and then a write operation of mutually mismatching bits is executed.

When the magnetic random access memory is used as a storage device, if free space C-buffer of the buffer memory is less than fixed value Nb, the third mode is selected in place of the second mode.

In third mode, the state of write data DATA_IN is determined, the number of bits where the magnetoresistive element is set to the "1" state is set as m1, the number of bits where the magnetoresistive element is set to the "0" state is set as m2, write data is written unchanged if m1>m2, and inversion data of write data is written if m1<m2.

According to the present embodiment, a magnetic random access memory capable of switching the use as a cache memory or main storage memory and the use as a storage device (file memory) and also achieving lower power consumption in each use can be realized.

FIG. 11 shows an example of a mask control signal generation circuit.

Table 3 is a logical table of the circuit in FIG. 11.

TABLE 3

| Control signal CNT | Mode selection signal φ1 | Mask control signal bM | Write control operation |
|---|---|---|---|
| "L" | "L" | ALL = "H" | Write all bits |
| "L" | "H" | bCOMP | Write bit in which DATA_IN and Rdata are congruous with each other (inversion write) |
| "H" | "L" | ALL = "H" | Write all bits |
| "H" | "H" | COMP | Write bit in which DATA_IN and Rdata are in congruous with each other (write with no change) |

When mode selection signal φ1 is "L" (="0"), inversion signal bM of mask control signal M is forcibly set to "H" (=Vdd) regardless of the value ("L" or "H") of control signal CNT. That is, a write operation is executed for all bits.

When control signal CNT is "L" (="0") and mode selection signal φ1 is "H" (="1"), inversion signal bCOMP of comparison signal COMP is output as inversion signal bM of mask control signal M. That is, a write operation is executed for matching bits (COMP="0") of write data DATA_IN and read data Rdata because inversion signal bM of mask control signal M becomes "1" (inversion writing).

When both of control signal CNT and mode selection signal φ1 are "H" (="1"), comparison signal COMP is output as inversion signal bM of mask control signal M. That is, a write operation is executed for mismatching bits (COMP="1") of write data DATA_IN and read data Rdata because inversion signal bM of mask control signal M becomes "1" (unchanged writing).

[Others]

In the above embodiment, when the magnetic random access memory is used as a cache memory or main storage memory, the first mode is selected. This is because reading is generally more frequent than writing when used as a cache memory or main storage memory. However, instead of the first mode, the second mode (further, the third mode) may be selected in accordance with characteristics (for example, whether reading occurs more frequently or writing occurs more frequently in the magnetic random access memory) of the memory system.

When the magnetic random access memory is used as a cache memory, for example, the controller can determine whether reading occurs more frequently or writing occurs more frequently in the magnetic random access memory from a program (ROM information). If writing occurs more frequently, the second mode is selected even if the magnetic random access memory is used as a cache memory.

When a mode that frequently replaces data like a cache memory having ways and a mode that does not frequently replace data can be switched, a control method of selecting the second mode when data is frequently replaced and selecting the first mode when data is not frequently replaced can also be implemented.

Further, whether to select the first mode or the second mode may also be uniquely defined in accordance with whether to use the magnetic random access memory as an instruction cache or a data cache.

That is, according to the present embodiment, control may be exercised so that in general the first mode is selected for uses focused on reducing power consumption during reading and the second mode (further, the third mode) is selected for uses focused on reducing power consumption during writing.

[Application Example]

A magnetic random access memory according to the above embodiment can be applied to, for example, a cache memory of a low-power consuming processor.

If, for example, a conventional magnetic random access memory is used simply as a cache memory, a problem of increased power consumption particularly during reading is posed when compared with a cache memory of SRAM (SRAM cache).

In contrast, a cache memory (MRAM cache) of a magnetic random access memory according to the present embodiment can achieve lower power consumption during reading by the first mode and thus, lower power consumption during reading equivalent to that of an SRAM cache or more can be achieved.

FIG. 12 shows an example of memories in a processor.

CPU 31 controls SRAM 32, DRAM 33, flash memory 34, ROM 35, and MRAM (magnetic random access memory) 36.

MRAM 36 can be used as an alternative to any of SRAM 32, DRAM 33, flash memory 34, and ROM 35. Accordingly, at least one of SRAM 32, DRAM 33, flash memory 34, and ROM 35 may be omitted.

MRAM 36 can reduce power consumption during reading or writing by switching the mode according to the present embodiment.

[Conclusion]

According to the present embodiment, a magnetic random access memory capable of switching, for example, the use as a cache memory or main storage memory and the use as a storage device (file memory) and also achieving lower power consumption in each use can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory comprising:
magnetoresistive elements capable of storing one of a first resistance value and a second resistance value that is different from the first resistance value;
a write circuit to write s-bit (s is a natural number equal to 2 or greater) write data to the magnetoresistive elements, the write data supplied from a buffer memory;
a read circuit to read s-bit read data from the magnetoresistive elements; and
a control circuit that is configured to:
select one of first and second modes based on a mode selection signal;
control the read circuit so that the read circuit reads the read data and control the write circuit so that the write circuit writes one of the write data and inversion data of the write data to the magnetoresistive elements based on the read data and the write data, if free space of the buffer memory is equal to a fixed value or more when the second mode is selected; and
control the write circuit so that the write circuit writes one of the write data and the inversion data of the write data to the magnetoresistive elements, the one of the write data and the inversion data corresponding to a relation that a number of bits setting the magnetoresistive elements to the first resistance value is larger than a number of bits setting the magnetoresistive elements to the second resistance value, if the free space of the buffer memory is less than the fixed value when the second mode is selected.

2. The memory of claim 1,
wherein the control circuit is configured to:
set the number of mutually matching bits among s bits of the read data and s bits of the write data as n1 and the number of mutually matching bits among s bits of the read data and s bits of the inversion data of the write data as n2 when the second mode is selected and the free space of the buffer memory is equal to the fixed value or more;
execute mask processing to inhibit writing of the mutually matching bits before executing a write operation of mutually mismatching bits among the s bits of the write data if n1>n2; and
execute the mask processing to inhibit writing of the mutually matching bits before executing a write operation of mutually mismatching bits among the s bits of the inversion data of the write data if n1<n2.

3. The memory of claim 1,
wherein the control circuit is configured to:
set the number of bits setting the magnetoresistive elements to the first resistance value among s bits of the write data as m1 and the number of bits setting the magnetoresistive elements to the second resistance value as m2 when the second mode is selected and the free space of the buffer memory is less than the fixed value;
control the write circuit so that the write circuit writes the s bits of the write data to the magnetoresistive elements if m1>m2; and
control the write circuit so that the write circuit writes s bits of the inversion data of the write data to the magnetoresistive elements if m1<m2.

4. The memory of claim 1,
wherein the control circuit is configured to:
set the number of bits setting the magnetoresistive elements to the first resistance value among s bits of the write data as m1 and the number of bits setting the magnetoresistive elements to the second resistance value as m2 when the first mode is selected;
control the write circuit so that the write circuit writes the s bits of the write data to the magnetoresistive elements if m1>m2; and
control the write circuit so that the write circuit writes s bits of the inversion data of the write data to the magnetoresistive elements if m1<m2.

5. The memory of claim 1,
wherein the control circuit is configured to:
set a flag bit to a first value when s bits of the write data are written to the magnetoresistive elements;
set the flag bit to a second value when s bits of the inversion data of the write data are written to the magnetoresistive elements;
read s bits of the read data from the magnetoresistive elements when the flag bit is the first value; and
read s bits of the inversion data of the read data from the magnetoresistive elements when the flag bit is the second value.

6. The memory of claim 1,
wherein the first mode is selected for uses focused on lower power consumption during reading; and
the second mode is selected for uses focused on lower power consumption during writing.

7. The memory of claim 1,
wherein the first resistance value is larger than the second resistance value.

8. The memory of claim 1,
wherein the first resistance value is smaller than the second resistance value.

9. The memory of claim 1,
wherein the write data is sequentially supplied from a data series stored in the buffer memory to the write circuit in s bits.

10. The memory of claim 1,
wherein the inversion data of the write data is generated by a data inversion circuit.

11. The memory of claim 1, further comprising:
a selection transistor connected in series to one of the magnetoresistive elements.

12. A memory system comprising:
the memory of claim 1; and
a controller controlling an operation of the memory,
wherein the controller supplies the mode selection signal to the memory.

13. A memory system comprising:
the memory of claim 1;
the buffer memory temporarily storing the write data; and
a controller controlling operations of the memory of claim 1 and the buffer memory,
wherein the controller determines whether the free space of the buffer memory is equal to a fixed value or more, or less than the fixed value based on a free space signal indicating the free space of the buffer memory.

14. A method of writing write data from a buffer memory to a magnetic random access memory, the magnetic random access memory comprising:
- magnetoresistive elements capable of storing one of a first resistance value and a second resistance value that is different from the first resistance value;
- a write circuit to write s-bit (s is a natural number equal to 2 or greater) write data to the magnetoresistive elements; and
- a read circuit to read s-bit read data from the magnetoresistive elements, the method comprising:
- selecting one of first and second modes based on a mode selection signal;
- reading the read data by the read circuit and writing one of the write data and inversion data of the write data to the magnetoresistive elements by the write circuit based on the read data and the write data if free space of the buffer memory is equal to a fixed value or more when the second mode is selected; and
- writing one of the write data and the inversion data of the write data to the magnetoresistive elements by the write circuit so that a number of bits setting the magnetoresistive elements to the first resistance value is larger than a number of bits setting the magnetoresistive elements to the second resistance value if the free space of the buffer memory is less than the fixed value when the second mode is selected.

15. The method of claim 14, further comprising:
- setting the number of mutually matching bits among bits of the read data and s bits of the write data as n1 and the number of mutually matching bits among s bits of the read data and s bits of the inversion data of the write data as n2 when the second mode is selected and the free space of the buffer memory is equal to the fixed value or more;
- executing mask processing to inhibit writing of the mutually matching bits before executing a write operation of mutually mismatching bits among the s bits of the write data if n1>n2; and
- executing the mask processing to inhibit writing of the mutually matching bits before executing a write operation of mutually mismatching bits among the s bits of the inversion data of the write data if n1<n2.

16. The method of claim 14, further comprising:
- setting the number of bits setting the magnetoresistive elements to the first resistance value among s bits of the write data as m1 and the number of bits setting the magnetoresistive elements to the second resistance value as m2 when the second mode is selected and the free space of the buffer memory is less than the fixed value;
- writing the s bits of the write data to the magnetoresistive elements by the write circuit if m1>m2; and
- writing s bits of the inversion data of the write data to the magnetoresistive elements by the write circuit if m1<m2.

17. The method of claim 14, further comprising:
- setting the number of bits setting the magnetoresistive elements to the first resistance value among s bits of the write data as m1 and the number of bits setting the magnetoresistive elements to the second resistance value as m2 when the first mode is selected;
- writing the s bits of the write data to the magnetoresistive elements by the write circuit if m1>m2; and
- writing s bits of the inversion data of the write data to the magnetoresistive elements by the write circuit if m1<m2.

18. The method of claim 14, further comprising:
- setting a flag bit to a first value when s bits of the write data are written to the magnetoresistive elements;
- setting the flag bit to a second value when s bits of the inversion data of the write data are written to the magnetoresistive elements;
- reading s bits of the read data from the magnetoresistive elements when the flag bit is the first value; and
- reading s bits of the inversion data of the read data from the magnetoresistive elements when the flag bit is the second value.

19. The method of claim 14,
- wherein the first mode is selected for uses focused on lower power consumption during reading; and
- the second mode is selected for uses focused on lower power consumption during writing.

20. The method of claim 14, further comprising:
- supplying the mode selection signal from a controller to the magnetic random access memory.

21. The method of claim 14, further comprising:
- determining whether the free space of the buffer memory is equal to a fixed value or more, or less than the fixed value based on a free space signal indicating the free space of the buffer memory.

* * * * *

UNITED STATES PATENT AND TRADEMARK OFFICE
CERTIFICATE OF CORRECTION

PATENT NO.       : 8,824,199 B2  
APPLICATION NO.  : 13/763068  
DATED            : September 2, 2014  
INVENTOR(S)      : Noguchi et al.

Page 1 of 1

It is certified that error appears in the above-identified patent and that said Letters Patent is hereby corrected as shown below:

In the Claims

Claim 15, column 19, line 30, change "setting the number of mutually matching bits among bits" to --setting the number of mutually matching bits among s bits--.

Signed and Sealed this  
Twenty-third Day of December, 2014

Michelle K. Lee  
*Deputy Director of the United States Patent and Trademark Office*